US012593700B2

(12) United States Patent
Huang et al.

(10) Patent No.: US 12,593,700 B2
(45) Date of Patent: Mar. 31, 2026

(54) LOW PARASITIC INDUCTANCE POWER MODULE HAVING STAGGERED, INTERLEAVING CONDUCTIVE BUSBARS

(71) Applicant: SENTEC E&E CO., LTD., Taoyuan (TW)

(72) Inventors: Jason An Cheng Huang, Taoyuan (TW); Kun-Tzu Chen, Taoyuan (TW); Liang-Yo Chen, Taoyuan (TW); Pi-Sheng Hsu, Taoyuan (TW)

(73) Assignee: SENTEC E&E CO., LTD., Taoyuan (TW)

( * ) Notice: Subject to any disclaimer, the term of this patent is extended or adjusted under 35 U.S.C. 154(b) by 536 days.

(21) Appl. No.: 18/106,405

(22) Filed: Feb. 6, 2023

(65) Prior Publication Data
US 2024/0063149 A1     Feb. 22, 2024

Related U.S. Application Data

(63) Continuation-in-part of application No. 17/892,008, filed on Aug. 19, 2022, now Pat. No. 12,417,967.

(51) Int. Cl.
| | |
|---|---|
| *H01L 23/64* | (2006.01) |
| *H01L 23/498* | (2006.01) |
| *H01L 25/07* | (2006.01) |
| *H01L 23/00* | (2006.01) |

(52) U.S. Cl.
CPC ...... *H01L 23/645* (2013.01); *H01L 23/49844* (2013.01); *H01L 25/072* (2013.01); *H01L 24/48* (2013.01); *H01L 2224/48229* (2013.01); *H01L 2924/10272* (2013.01); *H01L 2924/1306* (2013.01)

(58) Field of Classification Search
CPC . H01L 23/645; H01L 25/072; H01L 23/49811
See application file for complete search history.

(56) References Cited

U.S. PATENT DOCUMENTS

2019/0067167 A1*   2/2019   Hong ................... H02M 7/003

FOREIGN PATENT DOCUMENTS

| | | | |
|---|---|---|---|
| CN | 202633698 U | * | 12/2012 |
| JP | 2015056972 A | * | 3/2015 |

* cited by examiner

*Primary Examiner* — Michele Fan
(74) *Attorney, Agent, or Firm* — Che-Yang Chen; Law Office of Michael Chen

(57) ABSTRACT

A low parasitic inductance power module having staggered, interleaving busbars, including: at least one base extending a long a length direction, the base having at least one current input busbar and at least one current output busbar, the current input busbar and the current out busbar being formed with a plurality of interdigitated contact terminals, respectively; a first unit comprising a first circuit base portion disposed on the base along the width direction, on the first circuit base portion being disposed a plurality of first power devices; and a second unit, whereby when current flows through the units and the individual interdigitated contact terminals, individual inductances produced thereby are cancelled with each other, whereby overall parasitic inductance of the power module is reduced.

5 Claims, 11 Drawing Sheets

PRIOR ART

PRIOR ART

LOW PARASITIC INDUCTANCE POWER MODULE HAVING STAGGERED, INTERLEAVING CONDUCTIVE BUSBARS

FIELD

The disclosure relates to a power module, and more particularly relates to a low parasitic inductance power module having staggered, interleaving busbars.

BACKGROUND

As one of trending technologies, third-generation semiconductors play a pivotal role in the development of 5G, electric vehicles (EVs), and regenerative energies. The third-generation semiconductors (or wide bandgap (WBG) semiconductors) generally refer to Silicon Carbide (SiC) or Gallium Nitride (GaN), the bandgap of which is about three times that of conventional semiconductors Silicon (Si) and Gallium Arsenide (GaAs). The larger bandgap allows WBG power devices to operate at high frequencies, high temperatures and high voltages, achieving optimum efficiency and stability in general.

Among various applications of third-generation semiconductors, demands from electric vehicles are undoubtedly a main driving force for the development of power semiconductor devices. The three core technologies for electric vehicles are "battery," "motor," and "power control unit", which will be briefly introduced below: first, a three-phase motor as the heart of an electric vehicle, which leverages an induced RMF (Rotating Magnetic Field) to actuate the rotor in the motor to rotate to further drive the shaft, wherein to induce the RMF, the three-phase motor requires alternating current (AC) with phase difference as the power source; however, a battery pack (e.g., a lithium battery) equipped to electric vehicles is a direct-current (DC) power supply, such that a DC-to-AC conversion is needed between the battery pack and the motor while this conversion is implemented via an inverter, the brain of electric vehicles.

The inverter not only serves a purpose of converting an input current into an AC signal, but also may control the three-phase motor with technologies such as pulse width modulation (PWM). The inverter is essentially a power module comprising the power semiconductors identified above, which realizes electric control of the motor via circuit design. For example, the faster the RMF revolves, the higher the speed of the rotor in the motor is, wherein the speed of rotation of the RMF is dictated by AC signal frequency, i.e., the electric vehicle may directly change its motor speed by controlling the frequency of the input current, which provides a more reliable, linear control than a conventional ICE (Internal Combustion Engine) mechanism. In addition, the magnitude of current inputted in the motor also has a direct impact on the intensity of induced magnetic field; therefore, an electric vehicle with a high-power output surely needs a power module that can handle high current.

According to Ampere's Law, in an AC circuit, a time-varying magnetic field is created when electric current travels through a wire or a power component, while according to Faraday's Law and Lenz's Law, the time-varying magnetic field in turn creates an opposing induced electromotive force that influences the current signal. This effect, due to its analogousness to inductance, is usually referred to as "parasitic inductance" or "stray inductance," which is practically unwanted as it hinders fast transform of current signals. Usually, such effect may be ignored under an operating condition where the frequency is not high; however, under high-frequency, high-current operating conditions, the impact of stray inductance will become increasingly exacerbated, which likely results in phase delay or phase lead of signals, causing overall distortion of the signals, thereby affecting transmission and conversion efficiency, degrading stability, and significantly affecting the motor's efficiency in converting the electric energy to mechanical energy.

The previously filed U.S. patent Ser. No. 10/405,450 reveals problems such as voltage overshoot and ringing induced by parasitic inductance in a high-power module; besides, a power module with a paralleled configuration further has a problem of inhomogeneous temperature distribution due to current imbalance. All of the above factors will result in circuit system instability, degraded conversion efficiency, or even limited maximum switching frequency. As illustrated in FIG. 1 accompanied to the present disclosure, the U.S. patent Ser. No. 10/405,450 provides a solution of reducing circuit length, increasing cross-sectional area of conductors, creating counteracting magnetic fields, minimizing module height, and placing the power device in closer proximity to the terminals, wherein after the current traveling through two power devices 7 along the current direction 8, a return zone 9 at the output busbar is formed, which may reduce locally induced parasitic inductance. However, the disclosed layout manner has a limited effect in reducing parasitic inductance since the output busbars located slightly above the center of the topology can only be placed in close proximity to the underlying circuit within a partial area of the center while the output busbars in the right side of the topology need to be spaced apart so as to avoid the bonding zone. Furthermore, as illustrated in FIG. 2 accompanied to the present disclosure, the U.S. Pat. No. 8,637,964 also discloses a low stray inductance power module, wherein an inflow-outflow return path is formed in the power module along the current direction 8 by placing the inflow-outflow return currents as close to the original current path as possible in the topology. However, this horizontally dual-loop layout design would result in inhomogeneous current in the case of a high current, high frequency inversion due to inconsistent travelling distances between the inner current flow path and the outer current flow path of each loop; in addition, respective outer current flow paths are relatively distant from each other, which limits the effect in countering stray inductances.

In view of the above, parasitic inductance is unwanted, but unavoidably present in a high frequency circuit. To address this problem, the inventors have researched on the inflow-outflow path in a power module and filed invention patent applications earlier. However, in subsequent studies, the inventors find that the earlier power modules still need improvement.

SUMMARY

Embodiments of the disclosure provide a low parasitic inductance power module, which significantly reduces the overall parasitic inductance by virtue of interdigitated contact terminals of a current input busbar and an interdigitated contact terminals of a current output busbar which generate mutually cancelled individual inductances when current flows therethrough.

Embodiments of the disclosure further provide a low parasitic inductance power module, wherein large-current signals are parallel connected, and with a busbar structure in which busbars are arrayed in a staggered manner and disposed at the same side edge, circuit leading-out is facilitated.

Embodiments of the disclosure provide a low parasitic inductance power module, which renders a higher scalability in designing a circuit structure for the low parasitic inductance power module by a staggered, interleaving configuration enabling swap between horizontal and vertical directions.

The low parasitic inductance power module according to the disclosure is applicable to an apparatus which needs high-frequency, high power input, such as a motor for an electric vehicle; the low parasitic inductance power module comprises: at least one base extending along a length direction, the base having two opposite side edges in the length direction, at least one current input busbar and at least one current output busbar, which are mutually insulative, being provided at one of the two opposite side edges, the current input busbar and the current out busbar being formed with a plurality of interdigitated contact terminals, respectively; a first unit comprising at least one first circuit base portion, on the first circuit base portion being disposed a plurality of first power devices, each of the first power devices having a first current input end and a first current output end, the first current input ends of all first power devices being parallel connected, the first current output ends of all first power devices being parallel connected, wherein the first current input ends are conductively mounted to the first circuit base portion, or alternatively, the first current output ends are conductively mounted to the first circuit base portion; and a second unit comprising at least one second circuit base portion, the second circuit base portion being spaced from the first circuit base portion, on the second circuit base portion being disposed a plurality of second power devices, each of the second power devices having a second current input end and a second current output end, the second current inputs of all second power devices being parallel connected, the second current output ends of all second power devices being parallel connected; wherein the second current input ends are conductively mounted to the second circuit base portion, or alternatively, the second current output ends are conductively mounted to the second circuit base portion; wherein one end of the first unit and one end of the second unit are serially connected via a plurality of serially-connected conductive members; wherein the other end of the first unit opposite the serially-connected end and the other end of the second unit opposite the serially-connected end are serially connected to the current input busbar and the current output busbar via a plurality of input conductive members and a plurality of mutually staggered output conductive members, respectively; wherein when the interdigitated contact terminals of the current input busbar and the interdigitated contact terminals of the current output busbar correspond at lengthwise positions, their projections on a plane formed by the length direction and the width direction are arrayed pairwise in a staggered, interleaving fashion with each pair including one interdigitated contact terminal of the current input busbar and one interdigitated contact terminal of the current output busbar, whereby when current flows through the interdigitated contact terminals of the current input busbar and the interdigitated contact terminals of the current output busbar, individual inductances produced thereby are cancelled with each other, whereby overall parasitic inductance of the power module is reduced.

According to the low parasitic inductance power module as disclosed, when the interdigitated contact terminals of the current input busbar and the interdigitated contact terminals of the current output busbar correspond at the lengthwise direction, their projections are arrayed pairwise in a staggered, interleaving fashion on a plane formed by the length direction and the width direction, whereby when current flows through the interdigitated contact terminals of the current input busbar and the interdigitated contact terminals of the current output busbar, individual inductances produced thereby are cancelled, such that the parasitic inductance of the overall power module, produced by the busbar portions upstream and downstream the inflow-outflow return circuit, is further reduced; a high current signal inputted in the module is homogeneously shared by paralleled power semiconductors such as SiC and GaN, wherein each power semiconductor is further arranged with a plurality of traces distributed in the width direction, such that lengthwise interconnection of the power semiconductors enables the high current to be stably inputted and outputted in a shared mode; the induced magnetic fields produced by individual traces are mutually cancelled within a proximal distance range; the input and output traces designed in a staggered, interleaving return topology enables further effective reduction of the parasitic inductance effect created by the high-frequency current; particularly, irrespective of interleaving in the width direction or interleaving in the height direction, or even simultaneous interleaving in both width direction and height direction, the height limit or width limit may be flexibility satisfied for users with different structural demands, thereby enabling fabrication of a high power module with superb high-frequency response and electric performance, which can effectively reduce the adverse impact of parasitic impedance; in addition, by arraying the current input busbar and current output busbar at the same side in a dense, interleaving manner, the high-frequency, high-current power module may achieve a better electric performance without being deteriorated by stray inductance; moreover, such configuration of the current input busbar and current output busbar is easily led out, thereby achieving objectives of the disclosure.

DETAILED DESCRIPTION

Figure 1:
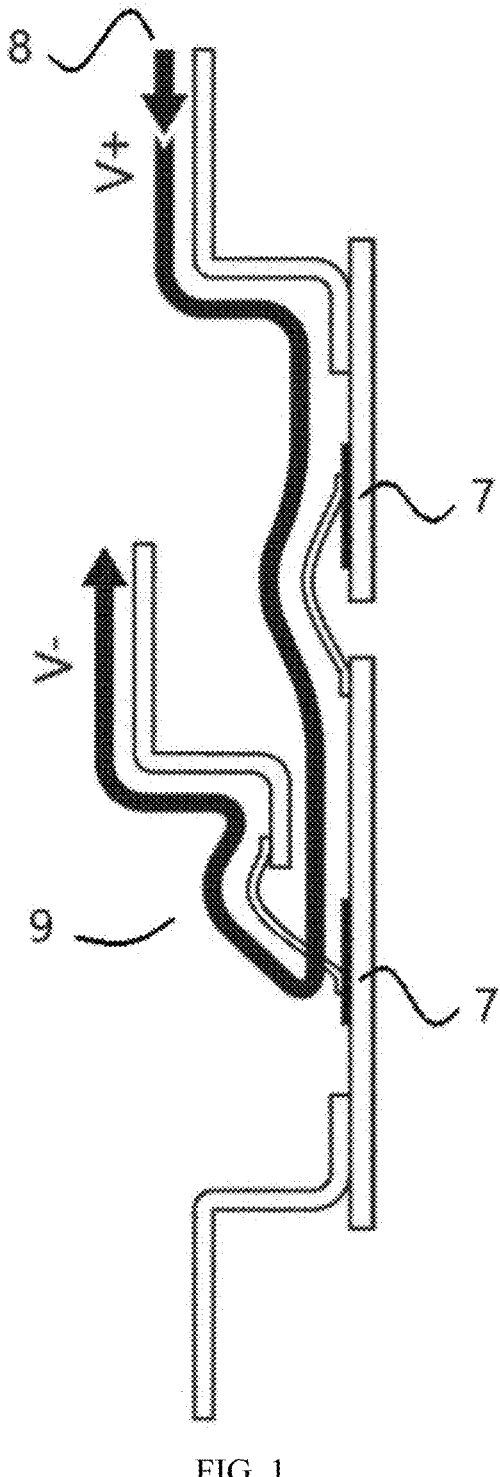
FIG. 1 is a schematic diagram of a known technology.
Figure 2:
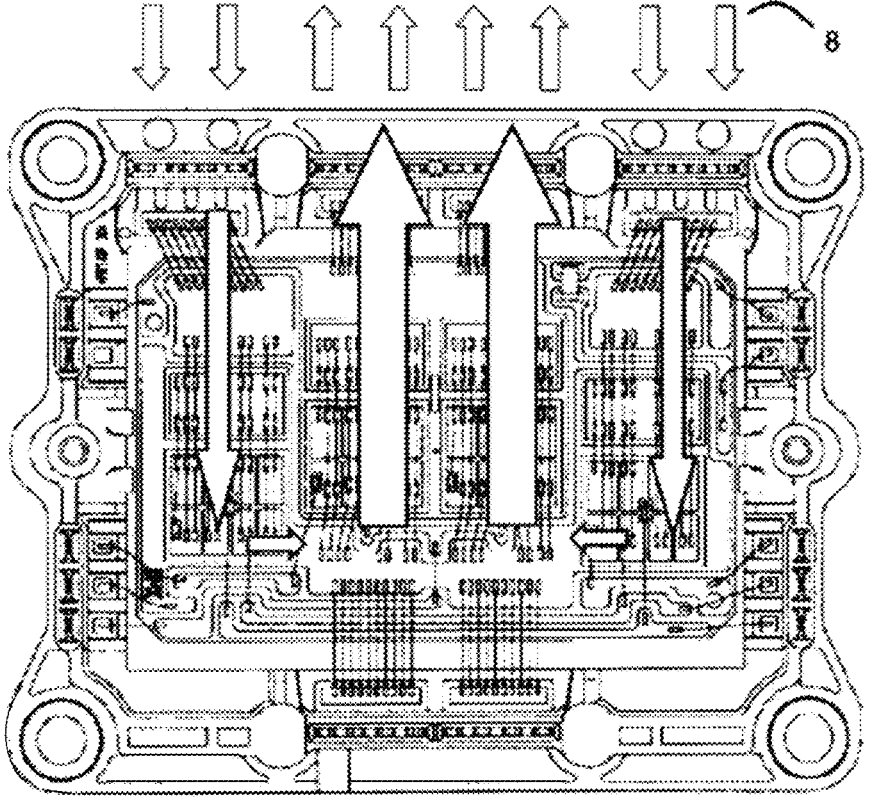
FIG. 2 is a schematic diagram of another known technology.
Figure 3:
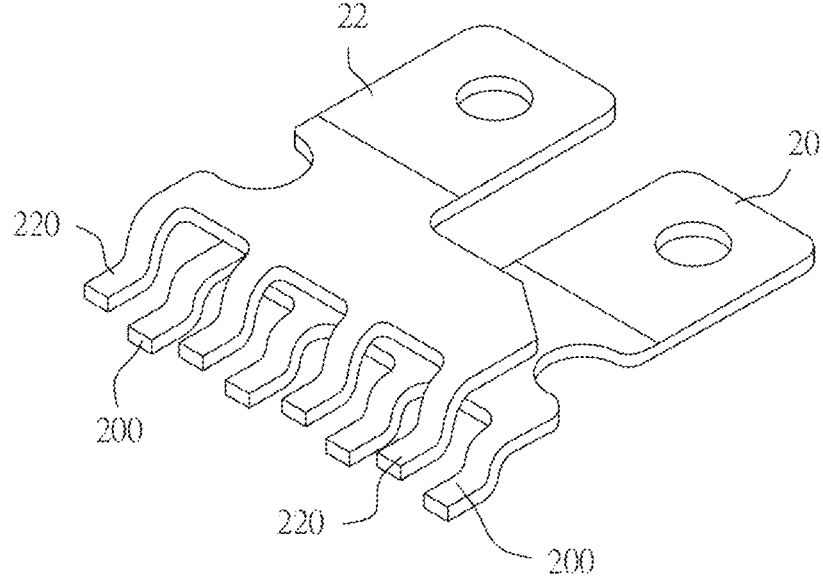
FIG. 3 is a stereoscopic structural diagram of an interdigitated contact terminal according to a first example of the disclosure, showing that individual interdigitated contact terminals of the current input busbar and individual interdigitated contact terminals of the current output bus are one-by-one interleaved.

Relevant technical contents, features and effects of the disclosure may be apparent through the embodiments described below with reference to the accompanying drawings, wherein like or similar components in various embodiments are represented by like or similar reference numerals.

Figure 4:
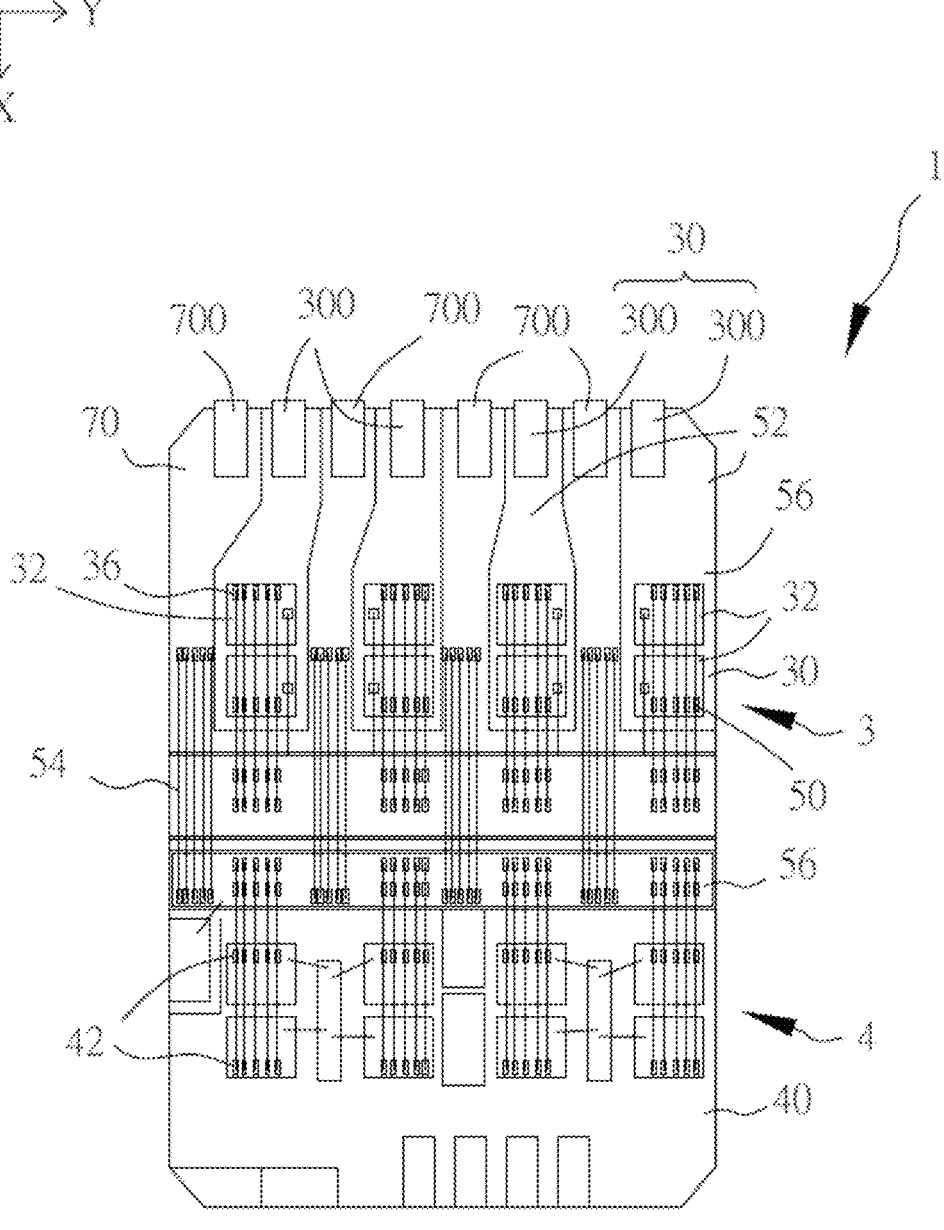
FIG. 4 is a top view of the first preferred example of the disclosure, showing how projections of the output inductive members, output conductive members, and serially-connected conductive members exhibit a staggered, interleaving topology on a plane formed by the length direction and the width direction.

FIGS. 3 to 6 illustrate a first embodiment of a low parasitic inductance power module 1, comprising: a base 2 provided with a current input busbar 20 and a current output busbar 22, the current input busbar 20 being formed with a plurality of interdigitated contact terminals 200, and the current output busbar 22 being formed with a plurality of interdigitated contact terminals 220, the interdigitated contact terminals 200 and the interdigitated contact terminals 220 being configured for conductively inputting a high-current signal (tens to hundreds of amperes) into various power devices. For ease of illustration, the vertical direction in FIG. 4 is defined as length direction X, the horizontal direction in the figure is defined as width direction Y, and the direction normal to the paper surface is defined as height direction Z. In this embodiment, the base 2 is a ceramic substrate made of a dielectric material, whereby a cooling device (not shown) may be placed underneath the power devices.

Figure 5:
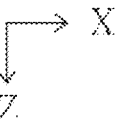
FIG. 5 is a side view of the example of FIG. 4, showing how to make the busbars approach to each other and be interleaved so as to cancel the stray inductance when their lengthwise positions correspond during the circuit return process.
Figure 5:
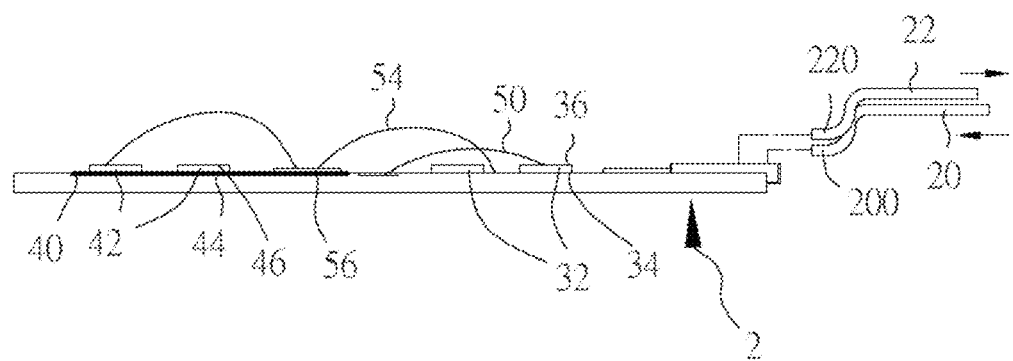

For ease of illustration, in this example, an end, which is soldered to the base, of the current input busbar 20 is split into four interdigitated contact terminals 200, and an end, which is soldered to the base, of the current output busbar 22 is split into four interdigitated contact terminals 220. Particularly, when the interdigitated contact terminals 200, 220 correspond at lengthwise positions, as illustrated in FIG. 5, their projections on the plane formed by the length direction and the width direction exhibit a topology in which one interdigitated contact terminal 220 of the current output busbar is definitely interposed between every two neighboring interdigitated contact terminals 200 of the current input busbar, such that the interdigitated contact terminals 200 and the interdigitated contact terminals 220 are arrayed pairwise in an interleaving, staggered fashion with each pair including one interdigitated contact terminal 200 and one interdigitated contact terminal 220. Therefore, as can be seen from the top view of FIG. 4, when each first solder terminal 300 is configured to solder-fit with one interdigitated contact terminal 200 of the current input busbar 20 and each second solder terminal 700 is also configured to solder-fit with one interdigitated contact terminal 220 of the current output busbar 22, the plurality of first solder terminals 300 formed on a first circuit base portion 30 and the plurality of second solder terminals 700 formed on a third circuit base portion 70 also exhibit a topology of being mutually separated and correspondingly spaced, and their projections on the plane constructed by the length direction and the width direction are also arrayed pairwise in an interleaving, staggered fashion with each pair including one first solder terminal 300 and one second solder terminal 700. In this way, when current is flowing through the interdigitated contact terminals 200 of the current input busbar 20 and the interdigitated contact terminals 220 of the current output busbar 22, individual inductances produced thereby are pairwise cancelled, whereby the parasitic inductances of the busbar portion before accessing the substrate and the busbar portion after leaving the substrate are reduced.

In addition, a first unit 3 is conductively connected to the current input busbar 20, the first unit 3 comprising a first circuit base portion 30 extending along the width direction Y, wherein eight first power devices 32, for example, are soldered in juxtaposition on the first circuit base portion 30. In this embodiment, the first power devices 32 are power transistors made of SiC. Of course, in alternative embodiments, other types of power transistors may be selected depending on specific applications, and the number of power transistors may be modified as well. Therefore, the exemplary illustration herein shall not be construed as limiting. In this embodiment, the first circuit base portion 30 comprises, for example, four sheets of metal circuit layers juxtaposed on the base 2 in the width direction, which are defined as input conductive members 52 herein; after the input current accesses the first solder terminals 300 from the interdigitated contact terminals 200 of the current input busbar 20, it is inputted into the first power devices 32 via a plurality of paralleled input conductive members 52. For ease of illustration, the electrodes, which are conductively soldered to the current input busbar 20, at the underside of the first power devices 32 are defined as first current input ends 34; after the input current is driven and conducted at the gates (without reference numeral) of the first power devices 32, it arrives at the first current output ends 36 on top surfaces of the first power devices 32, and dozens of traces are soldered in a staggered manner from the first current output ends 36 of the eight first power devices 32, thereby allowing for even sharing of an input high current of tens to hundreds of amperes, effectively mitigating the heating effect produced by the current when flowing through each conductive member.

In the first unit 3 of this embodiment, each of the first power devices 32 is synchronously controlled by a first gate signal. The first gate signal activates conduction between the source and the drain of each power transistor, such that the input current signal is transmitted from a plurality of paralleled first current output ends 36 through serially-connected conductive members 50 to a second circuit base portion 40 which is also formed on the base 2, and then flows into the paralleled eight second power devices 42 through the second current input ends 44. It is additionally noted that the serially-connected conductive members 50 traversed when the current signal flows out of the first power devices 32 use forty aluminum strips as traces, wherein the first current output end 36 of each first power device 32 is parallel soldered with five aluminum strips.

The eight second power devices 42 are synchronously controlled by a second gate signal, the second gate signal being configured to activate conduction between the source and the drain of each power transistor; the output current is likewise transmitted from the second current output ends 46 to an elevated plate 56 over the second circuit base portion 4 via the exemplarily illustrated forty aluminum strips and is then conducted to four juxtaposed second solder terminals 700 disposed on the third circuit base portion 70 via the output conductive members 54 including twenty aluminum strips, and finally collectively flows out from the interdigitated contact terminals 220 of the current output busbar 22.

Figure 6:
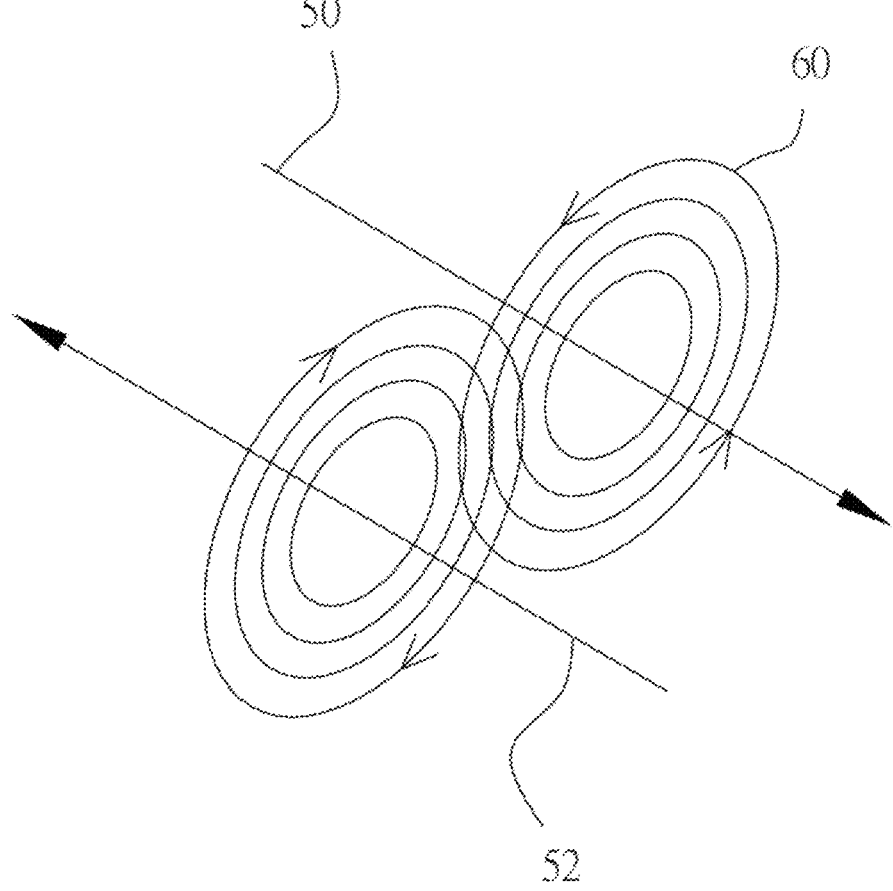
FIG. 6 is a projection schematic diagram of the current path in the example of FIG. 4, illustrating the principle of parasitic inductance cancellation.

It is seen that if the three-dimensional coordinates of each circuit or trace in the length direction X are defined one by one, individual interdigitated contact terminals 200 of the current input busbar 20 and individual interdigitated contact terminals 220 of the current output busbar 22 have their projections arrayed in an alternately interleaving, staggered fashion on a top-view plane formed by the length direction and the width direction when the interdigitated contact terminals 200 and the neighboring interdigitated contact terminals 220 are located at corresponding positions with consistent coordinates in the length direction, while their projections are partially overlapped and partially interleaved on the side-view plane formed by the length direction and the height direction, thereby realizing that the produced parasitic inductances are cancelled with each other, as illustrated in FIG. 6; compared with the ten or above nH in the control group, the overall inductance of the module adopting a circuit structure with the staggered, interleaving conductive busbars is reduced to one third thereof.

Of course, in this embodiment, the input conductive members 52 and the third circuit base portion 70 are coplanar, and their projections on the XY plane are also interleaved in pairs; the aluminum strips as the serially-connected conductive members 50 and the output conductive members 54 not only have their projections staggered, interleaved on the XY plane, but also have their projections partially crisscrossed on the XZ plane; furthermore, since the elevated plate 56 is superimposed over the underneath second circuit base portion 40, their projections on the XY plane are completely overlapped, such that the current flowing through the elevated plate 56 and the current outputted from the underneath second circuit base portion are distributed in a completely staggered, corresponding relationship, which means the paths traversed by the inflow current and the outflow current have substantially the same staggered, corresponding relationship at any position with the same coordinates in the length direction X, and the interleaving occurs at multiple positions on respective projection planes. In other words, the currents in opposite directions with overlapping projections definitely occur either on the XY plane or on the XZ plane, and with this staggered, interleaving, and corresponding distribution of current paths, as illustrated in FIG. 6, according to Ampere's Law (i.e., the magnetic field path integral of a closed loop is proportional to the magnitude of the current traveling through the closed loop), it may be derived for each group of opposite current paths that the magnetic field integral path 60 at the closed loop encompassing four currents is zero, thereby achieving an effect of cancelling local inductance, which, reinforced with the pairwise staggered, interleaving conductive busbars of the disclosure, may further reduce the overall parasitic inductance of the power module.

In this embodiment, the conductive members do not extend purely along direction X, but have components in width direction Y and height direction Z when routing the circuit board or soldering the aluminum strips; however, those skilled in the art can understand that this staggered, interleaving loop design may ensure sufficiently homogeneous distribution of the overall current while still maintaining a close-proximity inflow-outflow return loop structure in the three-dimensional space, which may reduce the overall stray inductance of the power module till below 5 nH, or even below 2 nH. Compared with the distant loop designs in the cited previous patents, the disclosure has a more homogeneous current distribution; through Ampere's Law analysis, the disclosure also achieves a far smaller integral path than the cited previous patents, eliminating a need to extend the integral area to cover the cross section of the entire module; in other words, even the cited previous patents had proposed a theoretical concept of reducing stray inductance, their overly large inflow-outflow return current distribution area not only results in inhomogeneous current, but also results in a very wide integral cross-section area for cancelling the stray inductance; therefore, their practical effect in cancelling the induced magnetic field is limited. In contrast, the staggered, interleaving design of the disclosure achieves an excellent effect in parasitic inductance cancellation.

For ease of illustration, in this embodiment, the current inflow path, i.e., the path from the current input busbar 20 through the first unit 3 and the serially-connected conductive members 50 till the second circuit base portion 50, is defined as the current inflow halfway, while the path from the second circuit base portion 40 through the second power devices 42, the elevated plate 56, the output conductive members 54 till the current output busbar 22 is defined as the current outflow halfway. It is apparent that the current in the inflow halfway and the current in the outflow halfway exhibit a spatial return correspondence, and the paths traversed by the currents are sufficiently staggered, and further interleaved on projection planes at multiple positions, such that each pair of inflow-outflow return paths are close enough. With this structural arrangement, the conductive members have an optimal structure in which the input conductive members and the output conductive members are pairwise staggered and interleaved with each pair including one input conductive member and one output conductive member.

Figure 7:
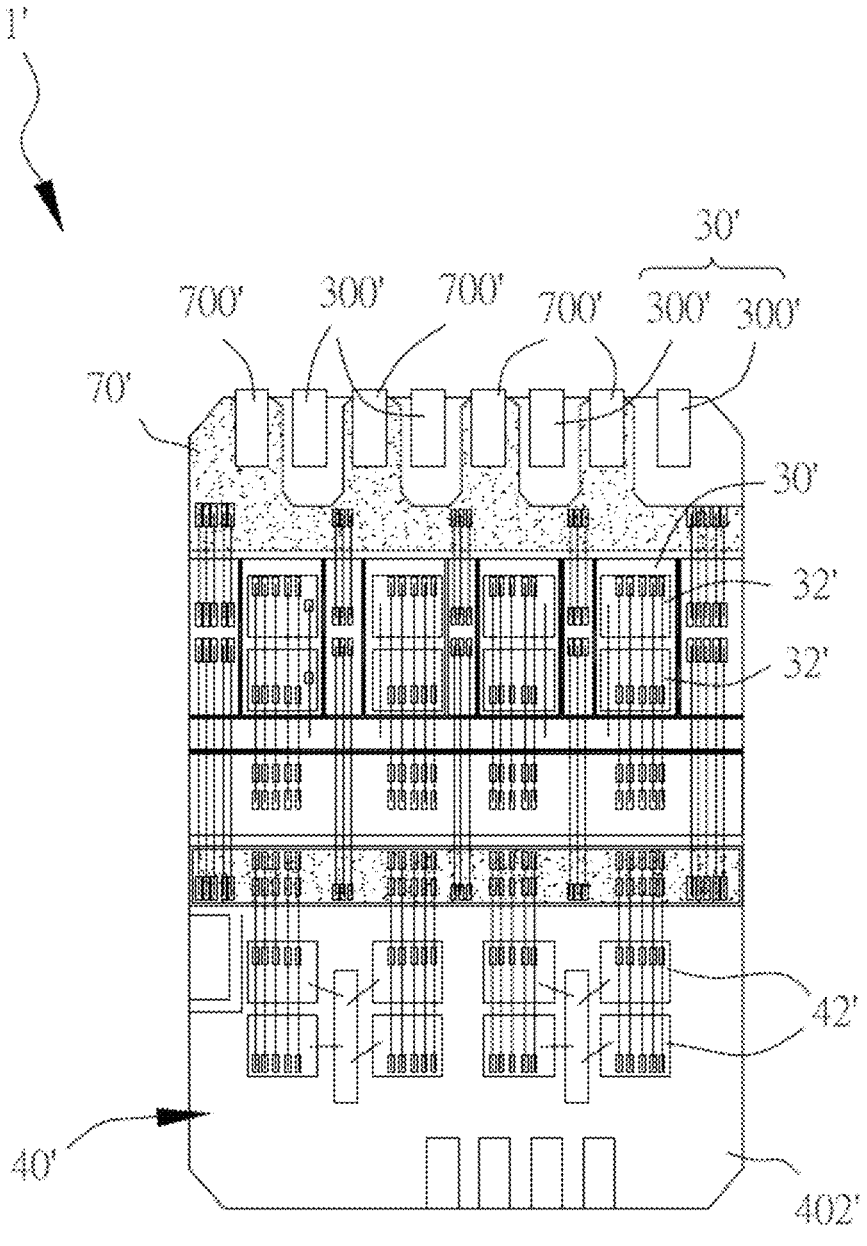
FIG. 7 is a top view of a power module of a second preferred example configured with the structure of FIG. 3, showing respective positions of a first solder terminal and a second solder terminal in the width direction and height direction.

Even the above embodiment illustrates an example in which the first circuit base portion 30, the second circuit base portion 40, and the third circuit base portion 70 are mutually insulative independent circuit blocks disposed on the same ceramic substrate, the circuit configuration of this disclosure is not limited to the above example. FIG. 7 illustrates a power module 1' according to a second preferred example of the disclosure, wherein the first circuit base portion 30', the second base portion 40', the first solder terminal 300', the first power devices 32', the second power devices 42', and the metal circuit layer 402' for soldering the second power devices 42', which are identical to the first preferred embodiment, will not be detailed. The main difference between this embodiment and the first embodiment lies in that the third circuit base portion in this example is an elevated leading-out circuit board 70' overlaid on the first circuit base portion 30'; in this embodiment, with a direct-bond-copper (DBC) circuit board as an example, the second solder terminal 700' is formed on the elevated leading-out circuit board 70'. Therefore, when the interdigitated contact terminals of the current input busbar and the interdigitated contact terminals of the current output busbar are located at corresponding positions in the length direction, the plurality of first solder terminals 300' formed on the first circuit base portion 30' and the plurality of second solder terminals 700' are not only separated and spaced from each other in pairs, but also slightly staggered in the height direction, such that from the perspective of their projections on the plane formed by the length and width directions, they are arrayed pairwise in a staggered, interleaving fashion with each pair including one first welding pad 300' and one second welding pad 700'; from the perspective of their projections on the plane formed by the length and height directions, they are partially overlapped and partially interleaved. As such, when current flows through the interdigitated contact terminals of the current input busbar and the interdigitated contact terminals of the current output busbar, individual inductances produced thereby will be cancelled, whereby the overall parasitic inductance is effectively reduced due to the staggered, interleaving arrangement starting from the input busbar and the output busbar.

Figure 8:
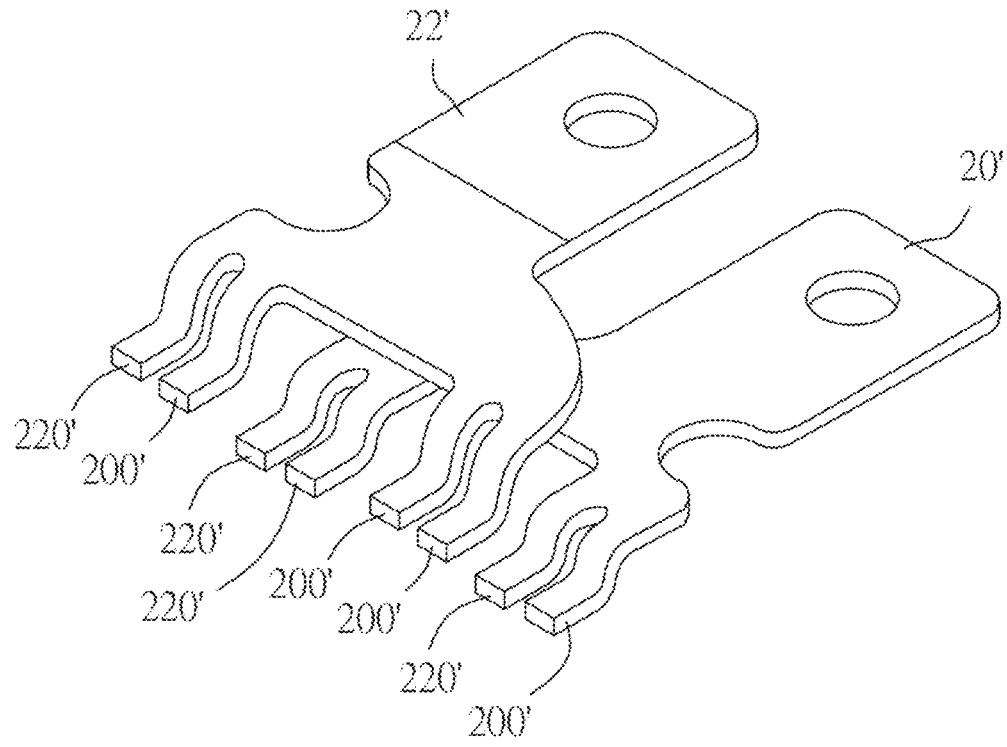
FIG. 8 is a stereoscopic structural schematic diagram of the interdigitated contact terminal in the second preferred example of the disclosure, showing that individual interdigitated contact terminals of the current input busbar correspond to individual interdigitated contact terminals of the current output busbar in a pairwise, interleaving fashion.
Figure 9:
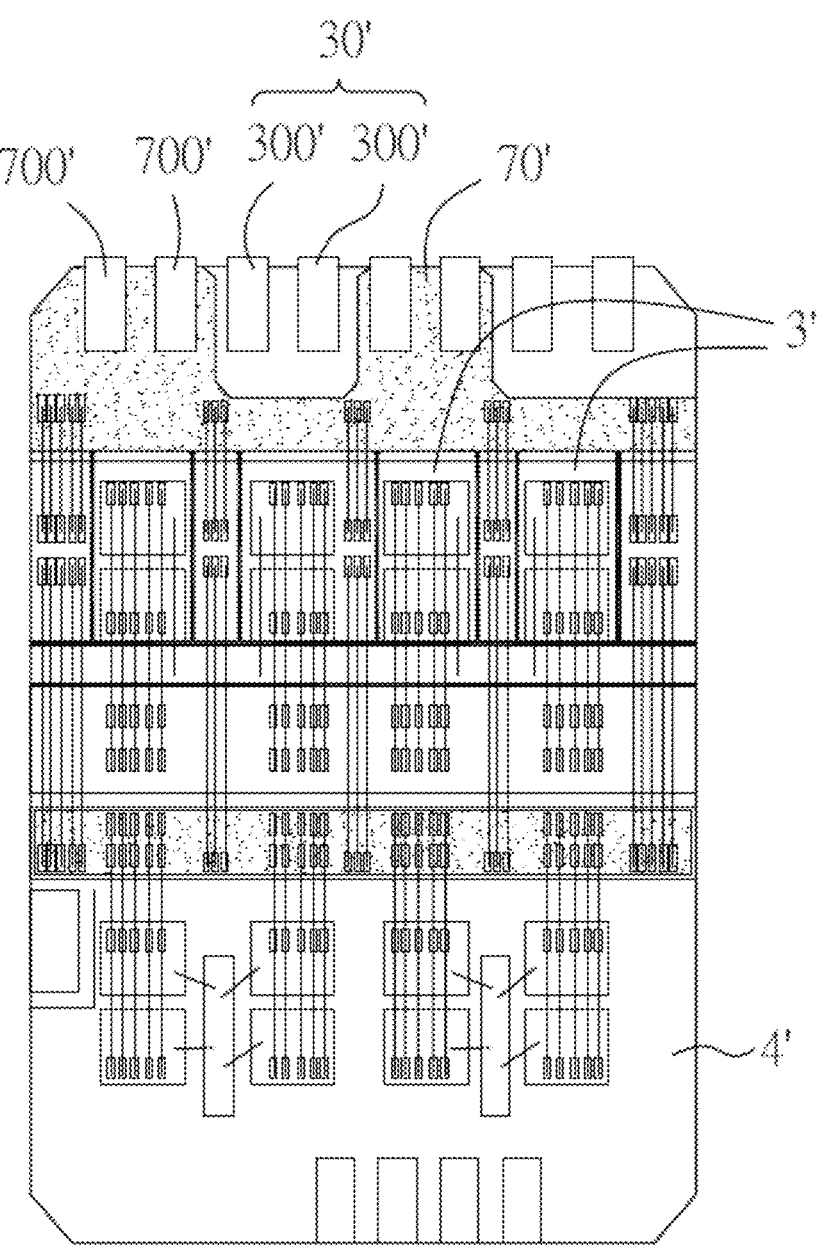
FIG. 9 is top view of the example of FIG. 8, showing the positions of the first solder terminal and the second solder terminal in the width and height directions.

The above described embodiments adopt a configuration in which individual interdigitated contact terminals of the current input busbar and individual interdigitated contact terminals of the current output busbar are paired in a one-by-one interleaving fashion. FIG. 8 shows a stereoscopic structural diagram of the interdigitated contact terminals in the second preferred embodiment of the disclosure, and FIG. 9 shows the corresponding mated power module 1'. Then, the configurations of the first circuit base portion 3' and the second circuit base portion 4' in the second embodiment differ from the first preferred embodiment in that the interdigitated contact terminals 200' of the current input busbar 20' and the interdigitated contact terminals 220' of the current output busbar 22' are interleaved in such a manner that two juxtaposed interdigitated contact terminals 220' as a group are interposed between two groups of interdigitated contact terminals 200' each including two juxtaposed interdigitated contact terminals 200'; while respective second solder terminals 700' are also disposed on the elevated leading-out circuit board 70' with two juxtaposed second solder terminals 700' in each group, and respective groups of first solder terminals 300' each including two juxtaposed first solder terminals 300' are interleaved between respective groups of second solder terminals 700', such that when current is flowing therethrough, the individual inductances produced will be cancelled, thereby reducing the overall parasitic inductance. However, its parasitic inductance reduction effect is slightly lower than the aforementioned embodiment where individual interdigitated contact terminals are one-by-one interleaved.

Figure 10:
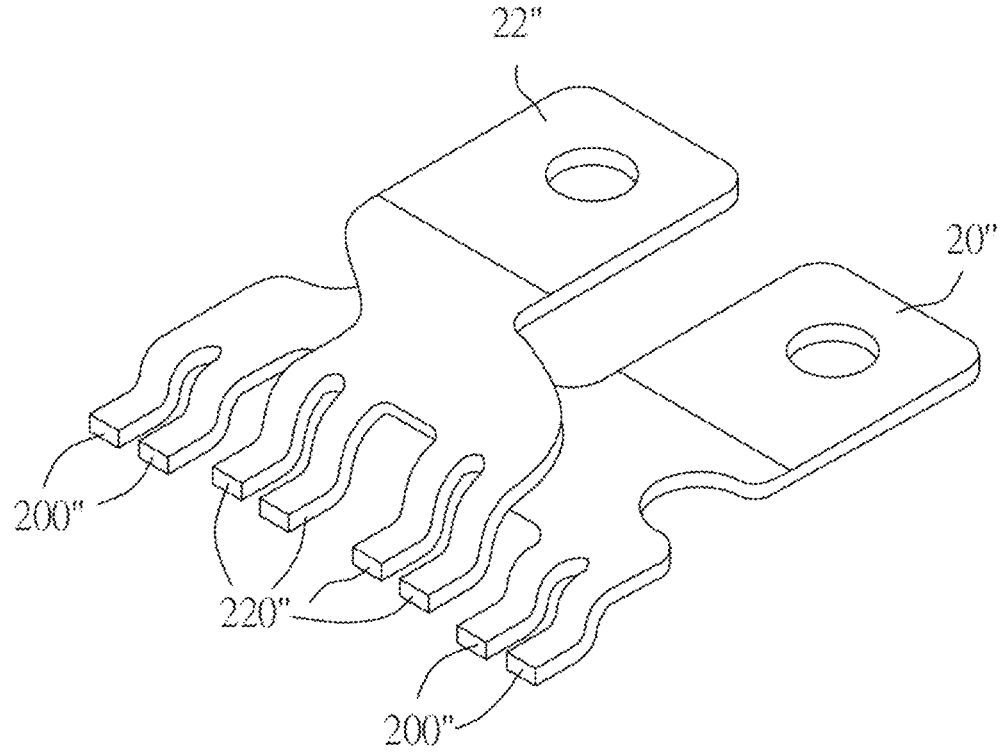
FIG. 10 is a stereoscopic structural schematic diagram of the interdigitated contact terminals in the third preferred example, showing that individual interdigitated contact terminals of the current output busbar are disposed at two sides of respective interdigitated contact terminals of the current input busbar, respectively.
Figure 11:
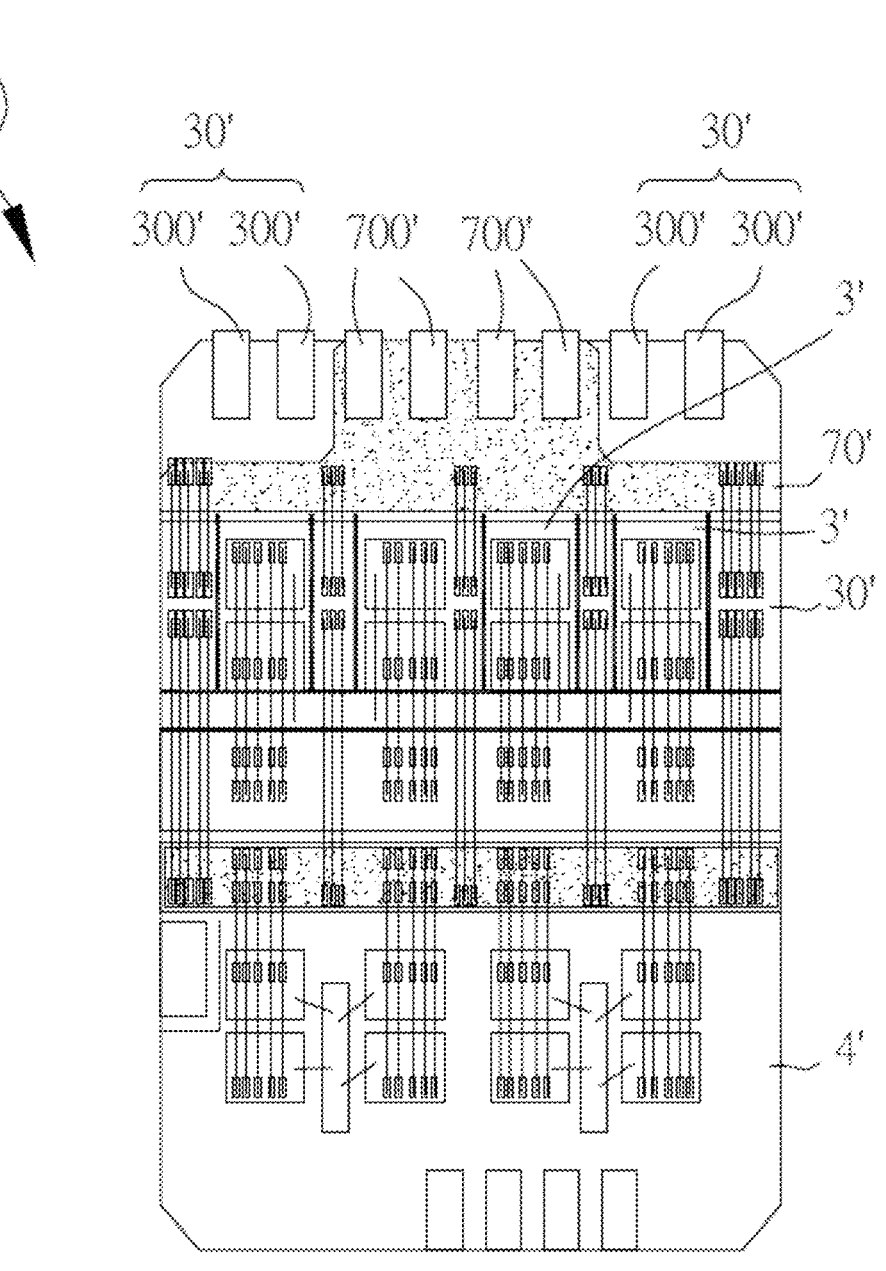
FIG. 11 is a top view of the example of FIG. 10, showing the positions of the first solder terminal and the second solder terminals in the width and height directions.

FIGS. 10 and 11 show a stereoscopic structural schematic diagram of the interdigitated contact terminals according to a third preferred embodiment. In the corresponding mated power module 1', configurations of the first circuit base portion 3' and the second circuit base portion 4' are identical to the second preferred embodiment, except that the interdigitated contact terminals 200" of the current input busbar 20" are grouped such that every four juxtaposed neighboring interdigitated contact terminals 200" are included in a single group, the interdigitated contact terminals 220" of the current output busbar 22" are grouped such that every two juxtaposed neighboring interdigitated contact terminals 220" are included in a single group, the second solder terminals 700' on the elevated circuit board 70' over the third circuit base portion are also arranged with four second solder terminals 700' being juxtaposed, while respective groups of first welding pads 300' on the first circuit base portion 30' are arranged such that two first solder terminals 300' are disposed at each side of the juxtaposed second solder terminals 700', respectively, whereby the overall parasitic inductance is reduced. Of course, the parasitic inductance reduction effect is further lower.

The current input busbar, the current output busbar, and the power module disclosed in the disclosure enable reduction of the overall parasitic inductance because individual inductances will be cancelled when current flows through the interdigitated contact terminals of the current input busbar and the interdigitated contact terminals of the current output busbar. In addition, when mated with the paralleled circuits and power devices disclosed in the previous applications of the inventors, the present disclosure may achieve a better stray inductance cancellation effect. Furthermore, the plurality of distributed, interleaving interdigitated contact terminals, in conjunction with corresponding between their current flowing paths, jointly and homogeneously share the input high current, which ensures homogenous current distribution in the current flowing process; moreover, the circuits form staggered loops where the current paths in the module are staggered, interleaving, corresponding to each other, and close to overlap. This staggered, interleaving conduction configuration significantly reduces the parasitic inductance effect. Accordingly, the module provided by the disclosure may reduce the parasitic inductance till below 5 nH; particularly, by arranging the input busbar and the output busbar at the same side edge, circuit leading-out is facilitated. The illustrations of the above embodiments are intended only for easy understanding, not for limiting. Any equivalent effects and other variations and modifications according to the appended claims fall within the protection scope of the disclosure.

We claim:

1. A low parasitic inductance power module having staggered, interleaving conductive busbars, comprising:

at least one base extending along a length direction, the base having two opposite side edges in the length direction, at least one current input busbar and at least one current output busbar, which are mutually insulative, being disposed at positions corresponding to one of the two opposite side edges, the current input busbar and the current out busbar being formed with a plurality of interdigitated contact terminals, respectively;

a first unit comprising at least one first circuit base portion, on the first circuit base portion being disposed a plurality of first power devices, each of the first power devices having a first current input end and a first current output end, the first current input ends of all first power devices being parallel connected, the first current output ends of all first power devices being parallel connected, wherein the first current input ends are conductively mounted to the first circuit base portion, or alternatively, the first current output ends are conductively mounted to the first circuit base portion; and a second unit comprising at least one second circuit base portion, the second circuit base portion being spaced from the first circuit base portion, on the second circuit base portion being disposed a plurality of second power devices, each of the second power devices having a second current input end and a second current output end, the second current inputs of all second power devices being parallel connected, the second current output ends of all second power devices being parallel connected; wherein the second current input ends are conductively mounted to the second circuit base portion, or alternatively, the second current output ends are conductively mounted to the second circuit base portion;

wherein one end of the first unit and one end of the second unit are serially connected via a plurality of serially-connected conductive members; wherein the other end of the first unit opposite the serially-connected end and the other end of the second unit opposite the serially-connected end are serially connected to the current input busbar and the current output busbar via a plurality of input conductive members and a plurality of mutually staggered output conductive members, respectively;

wherein when the interdigitated contact terminals of the current input busbar and the interdigitated contact terminals of the current output busbar correspond at lengthwise positions, their projections on a plane formed by the length direction and the width direction are arrayed pairwise in a staggered, interleaving fashion with each pair including one interdigitated contact terminal of the current input busbar and one interdigitated contact terminal of the current output busbar, whereby when current flows through the interdigitated contact terminals of the current input busbar and the interdigitated contact terminals of the current output busbar, individual inductances produced thereby are cancelled with each other, whereby overall parasitic inductance of the power module is reduced.

2. The low parasitic inductance power module having staggered, interleaving conductive busbars according to claim 1, wherein the base is a dielectric layer, and the first circuit base portion and the second circuit base portion refer to mutually insulative metal circuit layers formed on the dielectric layer.

3. The low parasitic inductance power module having staggered, interleaving conductive busbars according to claim 2, wherein when the interdigitated contact terminals of the current input busbar and the interdigitated contact terminals of the current output busbar correspond at lengthwise positions, a plurality of first welding pads, which are separated and correspondingly spaced from each other, are formed on the first circuit base portion, a plurality of second welding pads, which are separated and correspondingly spaced from each other, are formed on the second circuit base portion, the first welding pads being configured to solder-fit with the interdigitated contact terminals of the current input busbar, the second welding pads being configured to solder-fit with the interdigitated contact terminals of the current output busbar, projections of the first welding pads and projections of the second welding pads being arrayed in a staggered, interleaving fashion on the plane formed by the length direction and the width direction.

4. The low parasitic inductance power module having staggered, interleaving conductive busbars according to claim 1, wherein the base is an insulative base, and the first circuit base portion and the second base portion refer to two circuit boards disposed on the insulative base, respectively.

5. The low parasitic inductance power module having staggered, interleaving conductive busbars according to claim 4, wherein when the interdigitated contact terminals of the current input busbar and the interdigitated contact terminals of the current output busbar correspond at lengthwise positions, a plurality of first welding pads, which are separated and correspondingly spaced from each other, are formed on the first circuit base portion, a plurality of second welding pads, which are separated and correspondingly spaced from each other, are formed on the second circuit base portion, the first welding pads being configured to solder-fit with the interdigitated contact terminals of the current input busbar, the second welding pads being configured to solder-fit with the interdigitated contact terminals of the current output busbar, projections of the first welding pads and projections of the second welding pads being arrayed in a staggered, interleaving fashion on a plane formed by the width direction and the length direction.

* * * * *